United States Patent [19]

Schubert

[11] Patent Number: 4,760,036
[45] Date of Patent: Jul. 26, 1988

[54] PROCESS FOR GROWING SILICON-ON-INSULATOR WAFERS USING LATERAL EPITAXIAL GROWTH WITH SEED WINDOW OXIDATION

[75] Inventor: Peter J. Schubert, Kokomo, Ind.

[73] Assignee: Delco Electronics Corporation, Kokomo, Ind.

[21] Appl. No.: 62,011

[22] Filed: Jun. 15, 1987

[51] Int. Cl.⁴ .................. H01L 21/76; H01L 21/263
[52] U.S. Cl. ........................................ 437/090; 437/83;
437/915; 437/908; 437/62; 148/DIG. 26;
148/DIG. 48; 148/DIG. 152; 148/DIG. 154;
156/610; 156/613; 156/644; 156/662
[58] Field of Search ................ 148/DIG. 26, 48, 71,
148/90, 117, 150, 152, 154, 164, 33.2, 33.3;
156/610, 612, 613, 614, 643, 651, 652, 653, 657,
662; 437/62, 67, 82, 83, 89, 90, 103, 106, 915,
908; 357/49, 60

[56] References Cited

U.S. PATENT DOCUMENTS

| Re. 31,580 | 5/1984 | Kooi | 357/23 |
|---|---|---|---|
| 3,544,858 | 12/1970 | Kooi | 317/235 |
| 3,725,751 | 4/1973 | Wakomiya | 437/83 |
| 3,855,009 | 12/1974 | Lloyd et al. | 437/84 |
| 3,958,040 | 5/1976 | Webb | 437/228 |
| 4,036,672 | 7/1977 | Kobayashi | 437/84 |
| 4,072,545 | 2/1978 | De La Moneda | 437/89 |
| 4,178,197 | 12/1979 | Marinace | 437/89 |
| 4,333,965 | 6/1982 | Chow et al. | 437/228 |
| 4,358,326 | 11/1982 | Doo | 437/83 |
| 4,384,301 | 5/1983 | Tasch et al. | 357/23 |
| 4,408,386 | 10/1983 | Takayashiki et al. | 437/89 |
| 4,424,621 | 1/1984 | Abbas et al. | 357/49 |
| 4,444,620 | 4/1984 | Kovacs et al. | 156/612 |
| 4,487,635 | 12/1984 | Kugimiya et al. | 427/53.1 |
| 4,494,303 | 1/1985 | Celler et al. | 437/62 |
| 4,498,226 | 2/1985 | Inoue et al. | 357/91 |
| 4,507,158 | 3/1985 | Kamins et al. | 156/612 |
| 4,522,682 | 6/1985 | Soclof | 156/647 |
| 4,533,431 | 8/1985 | Dargent | 156/643 |
| 4,570,330 | 2/1986 | Cogan | 156/643 |
| 4,654,958 | 4/1987 | Baerg et al. | 437/81 |

FOREIGN PATENT DOCUMENTS

| 1045111 | 12/1981 | European Pat. Off. | |
| 0037781 | 3/1977 | Japan | 437/62 |
| 0042144 | 3/1982 | Japan | 437/62 |
| 0053821 | 3/1983 | Japan | 437/83 |
| 0144949 | 7/1985 | Japan | 437/89 |

OTHER PUBLICATIONS

Douglas, "The Route to 3-D Chips", High Technology, Sep. 1983, pp. 55–59.

Primary Examiner—Brian E. Hearn
Assistant Examiner—William Bunch
Attorney, Agent, or Firm—Robert J. Wallace

[57] ABSTRACT

A process for growing silicon on insulator in which complete isolation of the grown silicon of the substrate silicon by an intermediate oxide layer is obtained. A first epitaxial lateral overgrowth technique is used to grow a continuous layer of silicon through seed holes in a patterned oxide layer overlying the silicon substrate. Then the silicon layer is etched to expose the seed holes which are then oxidized to make the oxide layer aperture-free. This is followed by a second epitaxial lateral overgrowth step to replace the silicon etched in the silicon layer to make the layer substantially planar.

8 Claims, 2 Drawing Sheets

PROCESS FOR GROWING SILICON-ON-INSULATOR WAFERS USING LATERAL EPITAXIAL GROWTH WITH SEED WINDOW OXIDATION

FIELD OF THE INVENTION

This invention relates to a process for preparing a silicon-on-insulator (SOI) wafer for use in the manufacture of integrated circuit devices.

BACKGROUND OF THE INVENTION

Silicon-on-insulator wafers are of considerable interest in microelectronics because they make feasible integrated circuits with low parasitic capacitances and improved isolation between circuit components. To achieve the maximum benefits of SOI, it is important that the silicon be of high quality, especially with respect to its crystal structure.

Various techniques have been proposed for growing high quality monocrystalline silicon-on-insulator, but none has proved completely satisfactory.

One of the techniques which has had some success involves an epitaxial-lateral-overgrowth (ELO) technique. In this technique, a monocrystalline silicon wafer has its top surface oxidized to form an insulator layer and this layer is then opened to expose regions of the silicon substrate to serve as seed holes. There then follows an epitaxial deposition of silicon to fill selectively the seed holes with vertically grown epitaxial silicon without deposition on the oxide and then without interruption to grow the silicon also laterally away from the filled hole and over the oxide layer as well as vertically. This technique has the disadvantages that the lateral overgrowth usually proceeds only so far before either silicon nucleation occurs on the oxide which interferes with the epitaxial lateral growth or the overgrowth becomes polycrystalline. Moreover, because of the seed holes, it is not completely SOI. In one form of this technique, the seed holes are placed very close together to reduce the possibility of nucleation before the lateral overgrowth merges to form the continuous silicon fill-in. A disadvantage of this technique is that because of the larger area of seed holes, the result is even less true SOI.

SUMMARY OF THE INVENTION

The present invention is a process which permits a true SOI structure in that it leaves no seed holes in the final structure. In particular, the invention involves a two-step ELO technique. It involves a first standard ELO process, then an etching of the grown silicon selectively to expose the original seed holes, then oxidation of the silicon exposed at the seed holes to make the oxide layer continuous, and finally a second ELO process using the first ELO as the seed crystal for filling the holes etched in the first ELO layer with epitaxial silicon.

In an illustrative embodiment of the invention, a monocrystalline silicon substrate has its top surface oxidized to form an insulator oxide layer. This layer is then patterned to form seed holes spaced close enough to permit reliable ELO. The surface of the grown silicon layer is then oxidized and the second oxide layer formed is then patterned to open holes overlapping the seed holes formed in the first oxide layer. The grown silicon layer is then etched to expose the original substrate where the seed holes were formed. This exposed silicon substrate is then oxidized to make the first oxide layer continuous. This is followed by a second ELO process to fill the holes made to expose the substrate, in which process the silicon grows laterally from the silicon walls of the holes to form a planar surface. There then is removed the remainder of the second oxide layer over the top of the laterally grown silicon. There results the desired SOI structure in which the insulator layer is continuous so that the grown silicon is completely isolated from the original silicon substrate.

BRIEF DESCRIPTION OF THE DRAWINGS

The invention will be better understood taken in conjunction with the accompanying drawings in which.

It is to be noted that the drawings are not to scale since the vertical dimensions are generally much smaller than the horizontal dimensions.

DETAILED DESCRIPTION

Figure 1:
FIGS. 1 through 12 show in cross-section an SOI structure in successive stages of its preparation in accordance with an embodiment of the invention.

FIG. 1 shows a monocrystalline silicon substrate 10, advantageously cut on a <100> crystal plane and lightly doped to be relatively free of crystal defects. This surface of the substrate 10 is then oxidized in conventional fashion to form thereover an oxide layer 12, typically about one micron thick.

Figure 2:
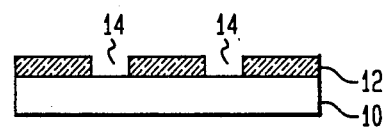
Figure 3:
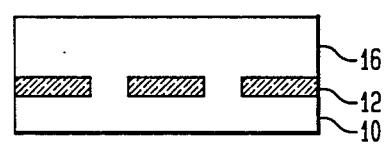

The oxide layer 12 is then patterned photolithographically in conventional fashion to form elongated openings 14 in the oxide layer, typically about one micron wide as shown in FIG. 2. The openings are spaced apart about twenty microns. This is sufficiently close such that ELO can be used readily to form a continuous, essentially monocrystalline, layer 16 over the substrate, as shown in FIG. 3, using the substrate silicon exposed at openings 14 for seeding in the manner known in the ELO art. If desirable, the quality of the grown layer 16 can be improved by known regrowth techniques, involving laser melting and freezing techniques.

The thickness of the layer grown need not be any thicker than can be reliably prepared in high quality form, for example, about 35 microns. If a lesser thickness is required, the reduction in thickness can be obtained by a silicon etch in conventional fashion after the inventive process has been completed. Typically, for ELO the silicon is grown in an oven at a temperature of about 800° C. and at a pressure of less than 10 Torr, in which hydrogen gas is flowed in at a rate of about 20 liters per minute, dichlorosilane gas at about 0.2 liters per minute, and hydrochloric acid at about 1 liter per minute. It is important to minimize carbon and oxygen impurities in the oven. The silicon grown typically will have a resistivity of between 50 and 100 ohm-centimeters.

Figure 4:
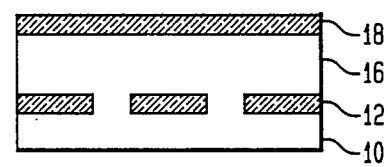

Then the surface of the grown layer 16 is oxidized in conventional fashion to form thereover an oxide layer 18, typically about 1000 Angstroms thick, as seen in FIG. 4.

Figure 5:
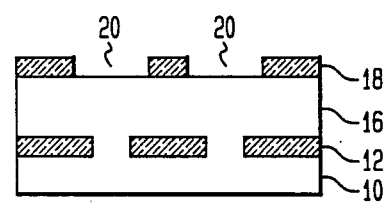

This layer 18 in turn is patterned by known photolithographic techniques to form openings 20 which overlap the narrower openings 14 in the first oxide layer 12 as shown in FIG. 5. Typically, these openings may be two or three microns wide centered to insure overlap.

Figure 6:
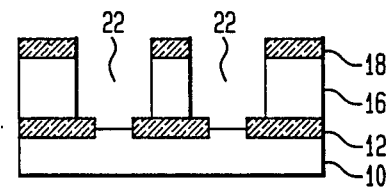

Then using the remainder of layer 18 as a mask, the ELO layer 16 is etched anisotropically, typically by reactive ion etching (RIE) in known fashion, to form openings 22 in the layer 15 which extend down to the original silicon substrate 12, as shown in FIG. 6. It may prove advantageous in some instances to retain the photoresist (not shown) which had overlain the oxide 18 and been used for masking when forming the holes 20, as an additional mask when patterning the layer 16 to form the openings 22.

Figure 7:
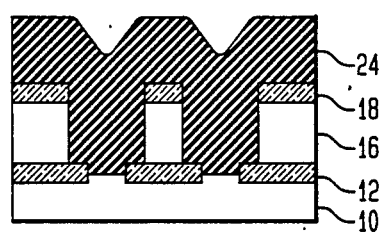

Next, a layer 24 of a suitable masking material, such as silicon nitride, is then conformally deposited in known fashion, typically by chemical vapor deposition, to a thickness of several thousand Angstroms, over the structure essentially to fill the openings in the layer 16, as seen in FIG. 7.

Figure 8:
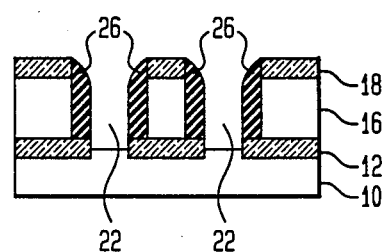

This is followed by another anisotropic etching step in known fashion, advantageously RIE, to remove most of the deposited silicon nitride, leaving only side wall spacers 26 in the opening 22 in the layer 16, as seen in FIG. 8. The spacers should be thin enough to leave fully exposed the original silicon substrate at the region of the seed holes 14.

Figure 9:
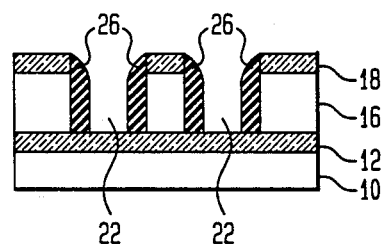
Figure 10:
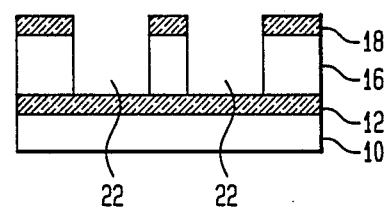

Then the wafer is heated in an oxidizing atmosphere in the usual fashion to oxidize the exposed silicon substrate, the sidewalls of the silicon layer 16 being masked by the silicon nitride spacers 26 to be unaffected. This step serves to make continuous the original oxide layer 12, as seen in FIG. 9. The side wall spacers 26 can now be removed by an etchant that selectively attacks only the silicon nitride, such as phosphoric acid at 140° C., to reach the structure shown in FIG. 10.

Figure 11:
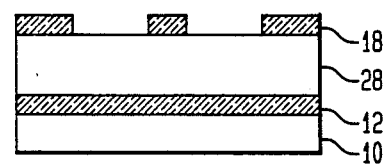

Next follows a second ELO step of the kind previously described to fill the openings 22 in the layer 16 and to form a substantially planar surface for the merged silicon layer 28, as shown in FIG. 11.

Figure 12:
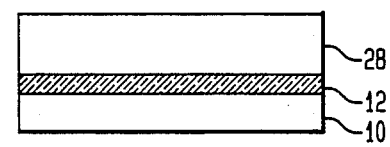

Finally, the portions remaining of the oxide layer 18 are selectively removed to leave the true SOI structure shown in FIG. 12 comprising the original silicon substrate 10 whose surface is coated with the continuous oxide layer 12 over which lies the continuous monocrystalline silicon layer 28, completely isolated from the original substrate 10.

In some instances, it may prove desirable to improve the quality of the final layer 28 also by the known regrowth technique involving laser melting and freezing. Moreover, if additional thickness for the layer 28 is desired, this can be done by growing silicon epitaxially on it in conventional fashion. Layer 28 can be made thinner by silicon etching or polishing.

It can be appreciated that the embodiments described are merely illustrative of the general principles of the invention and that various modifications may be made without departing from its spirit and scope. For example, the various dimensions mentioned are merely illustrative and others are feasible. Similarly different materials, for example, for masking, can be used.

The embodiments of the invention in which an exclusive property or privilege is claimed are defined as follows:

1. A process for providing an essentially monocrystalline silicon layer over an aperture-free oxide layer which overlies an essentially monocrystalline silicon substrate comprising the steps of:
   forming over the surface of the substrate a first oxide layer including a plurality of seed holes spaced apart in the layer;
   growing laterally epitaxial silicon through the seed holes and over the oxide layer to form a first continuous layer of essentially monocrystalline silicon over the oxide layer;
   etching the first continuous silicon layer to form openings therein and to expose the silicon substrate at the seed holes;
   selectively oxidizing the silicon substrate where exposed at the seed holes; and
   regrowing silicon laterally in the openings earlier etched in the first silicon layer to reform the first silicon layer into a continuous layer.

2. The process of claim 1 in which sidewalls of the openings formed in the continuous silicon layer are covered by a masking layer before the oxidation of the silicon substrate where exposed at the seed holes and the masking layer is removed before the regrowing of silicon to reform the first silicon layer.

3. The process of claim 2 in which the top of the first layer is covered by a masking layer during the etching to expose the seed holes and during the regrowing of the silicon to reform the first silicon layer.

4. The process of claim 2 in which said masking layer is of silicon nitride.

5. The process of claim 3 in which the masking layer over the top of the first layer is of silicon oxide.

6. The process of claim 5 in which the masking layer over the side walls is of silicon nitride.

7. A process for forming silicon over an insulator for use in integrated circuit manufacture comprising the steps of:
   growing over an essentially monocrystalline silicon substrate a layer of silicon oxide;
   forming a plurality of spaced seed holes in the oxide layer;
   growing epitaxial silicon laterally over the oxide layer using the silicon exposed at the seed holes for seeding until the grown silicon merges and forms a continuous layer over the oxide layer and making the continuous layer essentially monocrystalline;
   forming a second silicon oxide layer over the continuous silicon layer;
   forming openings in the second oxide layer overlapping the seed holes in the first oxide layer;
   etching the continuous silicon layer through the openings in the second oxide layer to form openings and to expose the silicon substrate at the seed holes;
   depositing thereover a blanket silicon nitride layer and etching the silicon nitride layer to provide side wall spacers in said openings in the silicon layer but leaving the silicon substrate exposed at the seed holes;
   oxidizing the silicon substrate where exposed at the seed holes for making continuous the first oxide layer;
   removing said silicon nitride spacers from the side walls to expose the side walls;
   regrowing silicon in said openings in the silicon layer to form a substantially planar surface; and
   removing remainders of the second oxide layer from the surface of the continuous silicon layer.

8. A process for forming silicon over an insulator for use in integrated circuit manufacture comprising the steps of:
   growing over an essentially monocrystalline silicon substrate a layer of silicon oxide;
   forming a plurality of spaced seed holes in the oxide layer;

growing epitaxial silicon laterally over the oxide layer using the silicon exposed at the seed holes for seeding until the grown silicon merges and forms a continuous layer over the oxide layer and making the continuous layer essentially monocrystalline;

forming a second silicon oxide layer over the continuous silicon layer;

forming in turn a polysilicon layer and a masking layer over the second silicon oxide layer;

patterning in turn the masking layer, the polysilioon layer and the second silicon oxide layer to form openings overlapping the seed holes;

etching the continuous silicon layer to form openings herein to expose the silicon substrate at the seed holes;

depositing thereover a blanket silicon nitride layer and etching the silicon nitride layer selectively to expose the silicon substrate at the seed holes, leaving covered the top and openings in the etched silicon layer;

oxidizing the silicon substrate where exposed at the seed holes;

removing remaining silicon nitride layer to expose the sidewalls of the openings in the silicon layer; and regrowing silicon laterally in the openings in the silicon layer to fill the openings and form a continuous substantially planar silicon layer.

* * * * *